United States Patent
Knutson et al.

(12) United States Patent <br>
Knutson et al.

(10) Patent No.: US 7,109,443 B2 <br>
(45) Date of Patent: Sep. 19, 2006

(54) MULTI-ZONE REFLECTING DEVICE FOR USE IN FLASH LAMP PROCESSES

(75) Inventors: Karson L. Knutson, Beaverton, OR (US); Jack Hwang, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/815,068

(22) Filed: Mar. 26, 2004

(65) Prior Publication Data

US 2005/0211697 A1    Sep. 29, 2005

(51) Int. Cl. <br>
*F27B 5/14* (2006.01)

(52) U.S. Cl. ............... 219/390; 219/405; 219/411; 392/416; 392/418; 392/420; 392/424; 392/427; 392/428; 392/422; 362/241; 362/297; 362/301; 362/346; 362/360; 250/504 R; 250/495.1

(58) Field of Classification Search ......... 219/390, 219/405, 411; 392/416, 418, 411, 420–424, 392/427–428; 362/241, 297, 301, 346, 341, 362/360; 250/504 R, 495.1 <br>
See application file for complete search history.

(56) References Cited

U.S. PATENT DOCUMENTS

| | | | | |
|---|---|---|---|---|
| 5,219,786 | A * | 6/1993 | Noguchi | 438/5 |
| 5,228,206 | A * | 7/1993 | Grant et al. | 34/275 |
| 5,997,175 | A * | 12/1999 | Champetier et al. | 374/126 |
| 6,385,396 | B1 * | 5/2002 | Liu et al. | 392/423 |
| 6,559,424 | B1 * | 5/2003 | O'Carroll et al. | 219/390 |
| 6,641,302 | B1 * | 11/2003 | Li et al. | 374/130 |
| 6,753,272 | B1 * | 6/2004 | Lee et al. | 438/795 |
| 6,771,895 | B1 * | 8/2004 | Gat et al. | 392/416 |
| 6,808,758 | B1 * | 10/2004 | Thakur | 427/559 |
| 6,835,914 | B1 * | 12/2004 | Timans | 219/390 |

* cited by examiner

*Primary Examiner*—Shawntina Fuqua <br>
(74) *Attorney, Agent, or Firm*—Schwabe, Williamson & Wyatt, P.C.

(57) ABSTRACT

A method, apparatus, and system including a reflecting device having a plurality of reflecting zones with associated reflectivities for reflecting light from a flash lamp, are described herein.

26 Claims, 3 Drawing Sheets

MULTI-ZONE REFLECTING DEVICE FOR USE IN FLASH LAMP PROCESSES

FIELD OF THE INVENTION

Embodiments of the present invention relate to substrate processing, and more particularly to a multi-zone reflecting device for use in flash lamp processes.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION

In the following detailed description, numerous specific details are set forth in order to provide a thorough understanding of embodiments of the present invention. However, those skilled in the art will understand that such embodiments may be practiced without these specific details. In other instances, well-known methods, procedures, and components have not been described in detail.

Although various discrete operations will be described herein, the mere order of description should not be construed as to imply that these operations are necessarily performed in the order they are presented.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment or invention. Furthermore, the particular features, structures, or characteristics may be combined in any suitable manner in one or more embodiments. Lastly, the terms "comprising," "including," "having," and the like, as used in the present application, are intended to be synonymous.

Figure 1:
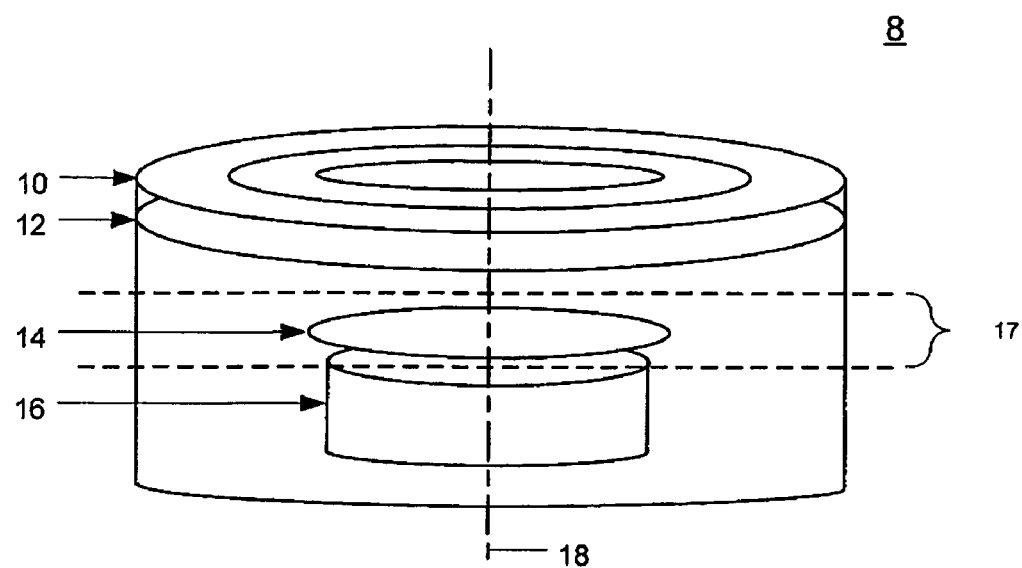
FIG. 1 is a simplified side view representing a flash lamp reactor with a multi-zone reflecting device, in accordance with an embodiment of the present invention.

FIG. 1 is a simplified side view diagram representing a flash lamp reactor 8 with a multi-zone reflecting device 10, in accordance with an embodiment of the present invention.

The flash lamp reactor 8 may include an array of flash lamps 12 located above a heater such as a hotplate 16, with a target area 17 situated between the two. The multi-zone reflecting device 10 may be positioned above the flash lamps 12 to advantageously reflect varying amount of radiation from the flash lamps 12 back towards different portions of a facing side of the target area 17. The target area 17 may be adapted to receive a substrate 14.

In one embodiment, the substrate 14 may be any type of ion-implanted material. Ion implantation may be used for a number of reasons in combination with a variety of different materials. It may be used to modify solid surfaces in order to improve wear resistance, fatigue life, corrosion protection, and/or chemical resistance of metals and alloys. Ion implantation may also be used, as it is in the semiconductor industry during the substrate preparation process, to introduce dopants to form source and drain regions. N-type regions in the substrate may be formed by doping the substrate with, for example, arsenic, phosphorus, and/or antimony; while p-type regions may be formed by using, for example, boron as a dopant. Examples of substrates suitable for this type of doping include, but are not limited to silicon, gallium arsenide, silicon germanium, and other semiconductor wafers. Ion implantation may also be used to introduce sublayers into these materials at different depths with different properties. For example, oxygen ions may be introduced to produce an oxidized dielectric layer.

Following ion implantation many of the ions may be located interstitially within the crystalline lattice of the substrate 14. A post-implant flash anneal at high temperatures may move some of these interstitially located ions into a substitutional position so that they may become electrically active. The flash anneal may also repair at least some of the implantation damage to the surface of the substrate 14. Activation may be accomplished by applying heat to the doped substrate, and as more heat is applied, more ions may be activated. However, during thermal activation, ions may excessively diffuse and deepen the junction depths. Therefore, it may be advantageous that the activation be done quickly in order to limit diffusing the implanted ions to an area outside of the desired doped region.

While much of the discussion regarding embodiments of this invention will specifically reference a post-implant flash anneal process, this is done solely for elucidation. The principles taught by the embodiments of this invention have a much broader application and may be applied to any flash lamp process. Some examples, include, but are not limited to, film densification, spin on glass (SOG) annealing, film morphology modification, silicidation, high k/metal gate applications, and defect annealing. Furthermore, reference to a "substrate" could include any type of material suitable for use in such processes.

The target area 17 may be specifically designed to accommodate substrates of various types, dimensions, rigidities, etc. For example, in one embodiment the target area may be designed to support a 300-mm silicon wafer. In various embodiments the substrate may sit directly on the backside heating device 16 or be positioned some distance above it. The substrate 14 may be placed in the target area 17 with the surface to be heated facing the flash lamps 12.

In one embodiment, the backside heating device 16 may be a hotplate that is designed to preheat the substrate 14 to a pre-flash temperature prior to the flash. Preheating the substrate 14 may assist in the uniform heating of the surface of the substrate during the flash lamp process by decreasing the total temperature fluctuation needed.

Figure 2:
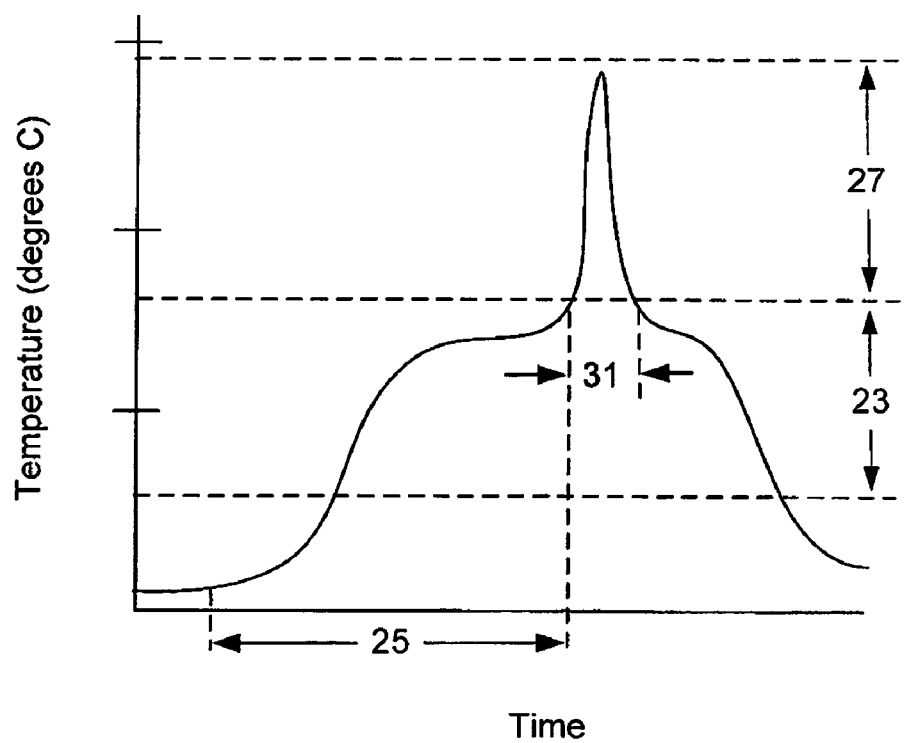
FIG. 2 is a graph representing the surface temperature of a substrate during a flash lamp anneal process, in accordance with an embodiment of the present invention.

FIG. 2 shows the timing of a post implant flash lamp anneal process in accordance with an embodiment of the present invention. In this embodiment, the pre-flash temperature may be a point just below the ion diffusion temperature 21. The ion diffusion temperature 21 may be the temperature at which ion migration begins to occur. For embodiments using a silicon substrate implanted with common dopants, this may be somewhere above 800 degrees Celsius (C). Therefore, in that embodiment, it may be desirable to have the preheating take place between 300–800 degrees C. 23. This preheat could take anywhere from between two seconds to several minutes 25. While this embodiment depicts the backside heating device 16 as a hotplate, any heater capable of heating the substrate 14 to the appropriate temperature in the appropriate time would be suitable (e.g., halogen or tungsten lamps). Alternative embodiments may not employ the use of a backside heating device at all.

In one embodiment, the flash lamps 12 may be a plasma type, e.g., a gaseous discharge lamp that is capable of producing high-intensity flashes of light for short durations. The flash lamps 12 may be capable of heating the surface of the substrate 14 to the appropriate annealing temperature range in a relatively short amount of time. The specific requirements of the flash lamps 12 will be application dependent and could relate to the time and temperature constraints involved in a particular process.

In an embodiment involving a post-implant flash anneal process, the annealing temperature range 27 may extend from approximately the ion diffusion temperature 21 to just below the melting temperature of the target substrate 29. For embodiments using a silicon substrate, these respective temperatures could be approximately 800 and 1409 degrees C. Substrate exposure in this range may be limited to prevent excessive ion diffusion.

Flash lamp processes may range from several milliseconds to less then one millisecond. Examples of types of flash lamps that are capable of heating the substrate surface to the desired temperature within the desired time constraints include, but are not limited to, Xenon, Mercury, or Krypton flash lamps.

Conversely, rapidly cooling the substrate surface following the flash lamp heating may be useful for particular embodiments. With relation to post implant flash annealing it may be useful by limiting the substrate surface's exposure in the ion diffusion range 27. Flashing the substrate surface may leave much of the rest of the substrate 14 at a lower temperature. Cooler parts of the substrate 14 may act as a heat sink by interacting with the heated surface until thermal equilibrium is reached between the two. This conductive heat transfer between the cool and hot parts of the substrate 14 may equilibrate more quickly than by relying on radiation losses between the substrate 14 and the surrounding air. Known thermodynamic principles dictating heat transfer may be employed to achieve the desired cool-down times for the specific materials and processes used in various embodiments.

A portion of the radiation generated from the flash lamps 12 may travel directly towards the target substrate 14, while radiation projected upwards may be reflected off of the multi-zone reflecting device 10 back towards the substrate 14. The temperature gradient incident on a portion of the substrate surface may depend on several factors including, but not limited to, the distance to the flash lamps 12, the wavelength of the radiation, whether the radiation is direct or reflected, the reflectivity of the reflector and the reflectivity of the substrate 14. As alluded to earlier, the multi-zone reflector 10 may be reflectively contoured such that areas of the substrate 14 that have less direct radiation from the flash lamps 12 may receive reflected radiation from zones of the multi-zone reflector 10 with a higher reflectivity. Conversely, the portions of the substrate 14 that have more direct radiation from the flash lamps 12 may need less reflected radiation, and therefore the corresponding reflector zone may employ reflectors with a relatively low reflectivity.

The number and reflectivity of the reflecting zones may be adjusted to complement a particular flash lamp reactor design of a given embodiment. Examples of factors to be considered could include the flash lamp configuration (e.g., the number and arrangement of the flash lamps), dimensions, and presence and type of a backside heating device. For example, one embodiment of the present invention could have a centralized lamp configuration by having a plurality of flash lamps located around the centerline of the reactor 18. In this embodiment it may be desirable to use a plate-type reflecting device. A plate-type reflecting device may be substantially two-dimensional (e.g., at least two dimensions of the reflecting surface being predominant in relation to the third dimension). The plate-type reflecting device may be axis-symmetrical around the centerline 18. One example of such a reflecting device is depicted in FIG. 3.

Figure 3:
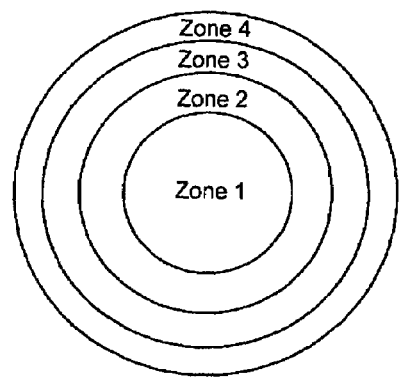
FIG. 3 is a bottom view of a concentric, multi-zone reflecting device, in accordance with an embodiment of the present invention.

FIG. 3 is a bottom view of a multi-zone reflecting device, in accordance with one embodiment of this invention. This embodiment illustrates four reflective zones that are oriented as concentric rings. Depending on the needs of the specific embodiment, the radii, number, and reflectivity of the zones may be adjusted. For example, in an embodiment using the centralized lamp configuration, discussed above, the temperature profile of the substrate 14 may decrease the farther from the centerline 18. Therefore the reflecting device may compensate for this decreasing temperature profile by providing higher reflectivity zones towards the perimeter (zones 3 and 4).

Reflectivity, which may be defined as the ratio of the intensities of the reflected and incident radiation, may be affected by the angle of incidence, the properties of the radiation (e.g., polarization and wavelength), and properties of the reflecting material. Examples of metals which may be used as reflectors include, but are not limited to: Aluminum (Al); Silver (Ag); Gold (Au); Copper (Cu); Nickel (Ni); Platinum (Pt); Stainless Steel; Molybdenum (Mo); and Rhodium (Rh). While each of these metals has its own reflective qualities they may also be manipulated by different chemical and physical processes. For example, polished aluminum may have reflectivities of over 0.9 for most wavelengths. However, anodizing the aluminum to create an aluminum oxide layer may reduce the reflectivity considerably.

Another process for reducing reflectivity is to sandblast the metallic surface. The reflecting zones of this embodiment may have small surface irregularities compared to the radiation wavelength in order to achieve specular or regular reflection. Therefore, increasing the surface irregularities compared to the radiation wavelength may cause the reflection to become more diffuse. There are numerous other methods that are known in the art to modify the reflectivity of metals used in the various zones of the reflecting device, any of which may be used in embodiments of the present invention. By utilizing different reflector materials and/or preparation processes to achieve the desired reflectivity, it may be possible to customize the multi-zone reflecting device 10 to facilitate substrate temperature uniformity during the flash lamp process.

Figure 4:
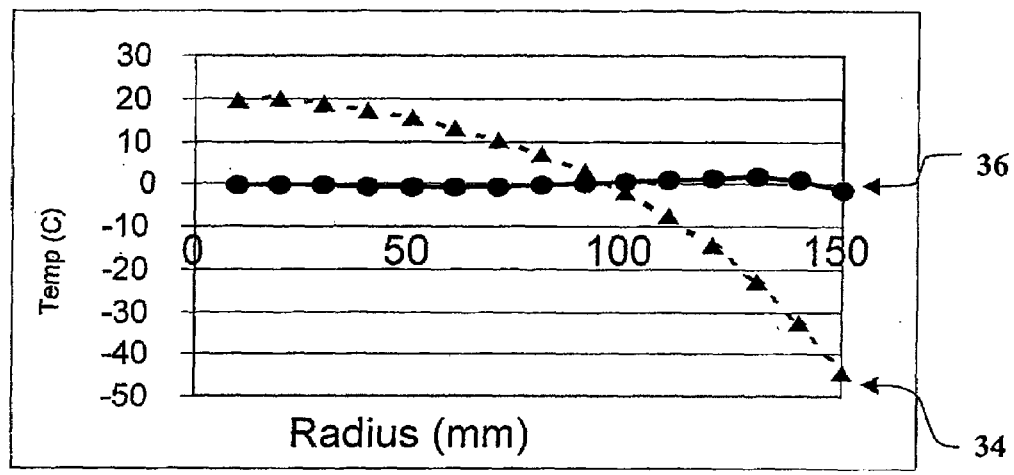
FIG. 4 is a graph representing a calibration process for a multi-zone reflecting device, in accordance with an embodiment of the present invention.

FIG. 4 shows a plot of substrate radius and cross substrate temperature variations that may be used in one embodiment of this invention for customizing a multi-zone reflecting device 10. The triangle line 34 may represent a single flash lamp configuration with a single reflector. In one embodiment, empirical analysis may reveal that the area of the substrate 14 directly under the flash lamp 12 exhibits the highest temperature profile, while the area at the perimeter of the substrate 14 exhibits the lowest. Therefore the multi-zone reflector 10 of this embodiment could include a low reflectance zone for radii below 100 mm and higher reflectance zone for radii above 100 mm, which may assist in normalizing the temperature distribution 36. It may be possible to get this type of empirical data from direct testing or through simulation analysis based on the known parameters of a given embodiment.

Figure 5:
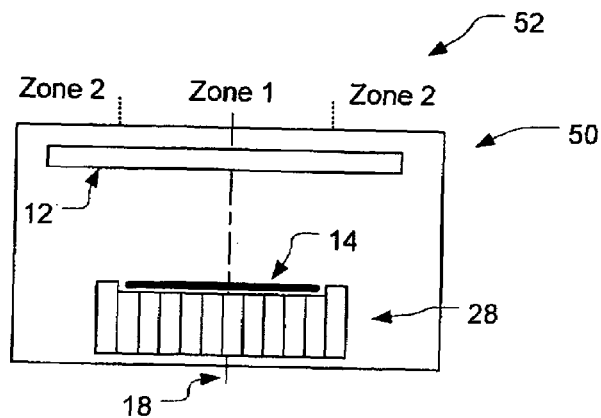
FIG. 5 is a cross-sectional view of a flash lamp reactor with a multi-zone reflector and a multi-zone backside heating device, in accordance with an embodiment of the present invention.

FIG. 5 is cross-section view of a flash lamp reactor 50 in accordance with one embodiment of this invention. In this embodiment the flash lamp reactor 50 may use a multi-zone reflecting device 52 with two zones, positioned above the flash lamp array 12. The substrate 14 may be placed in the target area between the flash lamp array 12 and a multi-zone backside heating device 28. In this embodiment, the multi-zone backside heating device may include independently controlled zones to fine-tune the pre-heating of the substrate to compensate for small variations among substrate lots (e.g., variations based on varying reflectivities of ion-implanted materials).

In one embodiment, substrates that receive similar processing may exhibit approximately the same reflectance properties however, these properties may change due to variance in the substrate preparation processes. For example, thin films (or patterns of thin films) deposited on the substrate may alter the reflectance, as will ion-implantation. Therefore it may be advantageous to design embodiments of this invention such that small variations of reflectance can be compensated by periodically adjusting the multi-zone backside heating device 28. For example, bare silicon substrates may require one set of zone settings, while patterned/coated substrates with different top surface reflectivities may require a second set of zone settings. By calibrating the zones of the multi-zone backside heating device 28 of this embodiment, it may be possible to preheat the substrate 14 in a way that would facilitate the generation of a substantially uniform temperature profile throughout.

Figure 6:
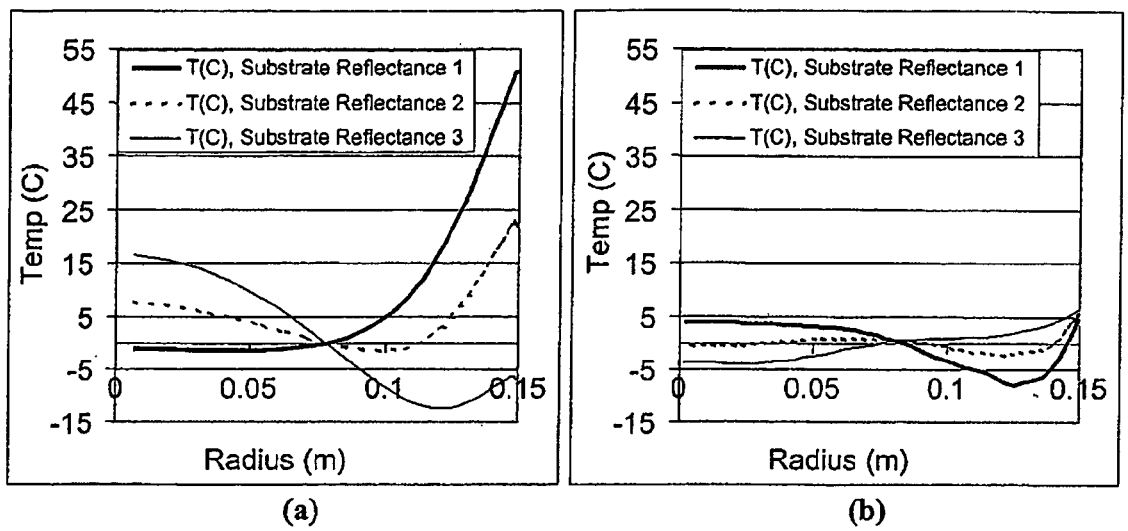
FIG. 6 is a graph representing a calibration process for a multi-zone backside heating device in accordance with an embodiment of the present invention.

FIG. 6 shows a graph that may be used to illustrate the calibration of the multi-zone backside heating device 28 to compensate for variations in the substrate temperature due to varying substrate reflectivity, in accordance with an embodiment of this invention. FIG. 6(a) shows the across substrate temperature variations for substrates of varying reflectivity. The variance of the reflectances may be a result of a particular substrate processing procedure, such as discussed above. In this embodiment, the multi-zone backside heating device 28 may have three different settings to compensate for the three different substrate reflectances. FIG. 6(b) may demonstrate the temperature variations of the same three substrate reflectances using the appropriate calibrated settings of the multiple-zone backside heating device 28. Therefore by knowing the particular characteristics of the specific lot being processed, it may be possible to dynamically adjust the flash lamp reactor in order to reduce the overall non-uniformity of temperature profiles of the substrates. So, while the multi-zone reflector 52 may be designed according to the size and/or type of substrate, the multi-zone backside heating device 28 may add the additional flexibility to adjust for variations (e.g., processing) among those substrates.

Figure 7:
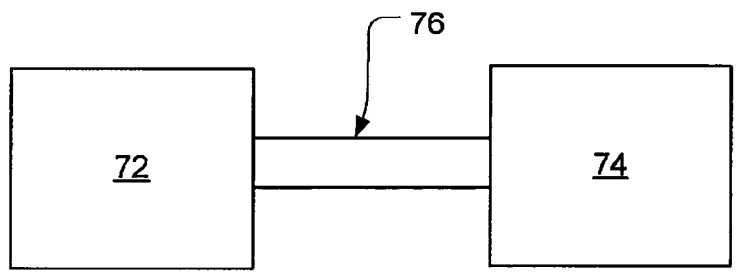
FIG. 7 is a block diagram of a system including a flash lamp reactor, in accordance with an embodiment of the present invention.

Referring to FIG. 7, there is illustrated one of many possible systems in which embodiments of the present invention may be used. In this embodiment, a system 70 includes a pre-flash processing device 72, a transfer mechanism 76, and a flash lamp reactor 74. The pre-flash processing device 72 may perform any type of process step to a substrate such that the substrate surface would benefit from a subsequent flash lamp process. Examples of a pre-flash processing device 72 could include, but are not limited to, an ion implantation device, a metal deposition device, a low k/high k deposition device, or any processing device that affects the first surface of the substrate such that a subsequent flash lamp process would be beneficial.

The transfer mechanism 76 may be used to move the substrate from the pre-flash processing device 72 to the flash lamp reactor 74. Examples of suitable transfer mechanisms include, but are not limited to, a pick-and-place device and a conveyor belt.

The flash lamp reactor 76 may then heat the surface of the substrate by raising it to a substantially uniform temperature. The flash lamp reactor 76 may be similar to any one of the reactors described in reference to the above embodiments.

Flash lamp processing based on embodiments of the present invention has been demonstrated to show the possibility of improving the uniformity of cross substrate temperature profiles. Furthermore, the efficient collection and distribution of the flash lamp radiation may result in lower power requirements and increased wafer temperature uniformity.

Thus, it can be seen from the above descriptions of embodiments of this invention that a novel approach to flash lamp processing has been described.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the above embodiments without departing from the scope of the present invention. Those with skill in the art will readily appreciate that the present invention may be implemented in a wide variety of embodiments. This application is intended to cover any adaptations or variations of the embodiments discussed herein. Therefore, it is manifestly intended that this invention be limited only by the claims and the equivalents thereof.

What is claimed is:

1. An apparatus comprising:
   a target area;
   a reflecting device having a first reflecting zone with a first reflectivity and a second reflecting zone with a second reflectivity that is different from the first reflectivity; and
   a flash lamp, disposed between the reflecting device and the target area, to provide radiation to be reflected off the reflecting device substantially towards a first side of the target area.

2. The apparatus of claim 1, further comprising
   a backside heating device to emit heat towards a second side of the target area.

3. The apparatus of claim 2, wherein the backside heating device comprises at least one of a group consisting of a hotplate, a tungsten lamp, and a halogen lamp.

4. The apparatus of claim 3, wherein the backside heating device further comprises a plurality of heating zones, each heating zone capable of being independently controlled.

5. The apparatus of claim 1, wherein the reflecting device is a plate-type reflector.

6. The apparatus of claim 5, further comprising:
a vertical axis substantially through the center of the apparatus; and
the reflecting zones being substantially symmetrical around the vertical axis.

7. The apparatus of claim 6, wherein the first and second zones are concentric rings.

8. The apparatus of claim 1, wherein each of the first and second reflecting zones comprises at least one of a group consisting of aluminum, gold, stainless steel, and molybdenum.

9. The apparatus of claim 1, wherein the flash lamp comprises a plasma-type flash lamp.

10. The apparatus of claim 9, wherein the plasma-type flash lamp comprises a Xenon lamp or a Mercury lamp.

11. The apparatus of claim 1, wherein the target area is adapted to receive a substrate.

12. The apparatus of claim 11, wherein the substrate comprises a 300-mm semiconductor wafer.

13. The apparatus of claim 1, wherein the first reflecting zone is configured to reflect radiation received from the flash lamp substantially towards a first area of the first side and the second reflecting zone is configured to reflect radiation received from the flash lamp substantially towards a second area of the first side, which is different than the first area.

14. The apparatus of claim 1, wherein the first reflecting zone is configured to receive radiation provided from the flash lamp in a first direction and the second reflecting zone is configured to receive radiation provided from the flash lamp in a second direction, which is different from the first direction.

15. A method for flash lamp processing comprising:
generating radiation from a flash lamp disposed between a reflecting device and a target area; and
reflecting a first portion of the radiation with a first reflecting zone of the reflecting device toward the target area, the first reflecting zone having a first reflectivity; and
reflecting a second portion of the radiation with a second reflecting zone of the reflecting device toward the target area, the second reflecting zone having a second reflectivity that is different from the first reflectivity.

16. The method for flash lamp processing of claim 15, wherein the reflecting device is a plate-type reflector that is substantially axis-symmetric around a vertical axis.

17. The method for flash lamp processing of claim 15, further comprising:
heating a second surface of the substrate with a backside heating device to a pre-flash temperature prior to generating radiation from the flash lamp.

18. The method for flash lamp processing of claim 17, wherein the backside heating device comprises a plurality of heating zones, and the method further includes independently controlling the plurality of heating zones based at least in part on reflectivity of portions of the substrate.

19. The method for flash lamp processing of claim 17, further comprising:
activating implanted ions in the first surface of the substrate by heating the second surface to a pre-flash temperature approximately at or below an ion diffusion temperature; and
heating the first surface of substrate to a temperature approximately between the ion diffusion temperature and a substrate melting temperature, said heating the first surface done, at least in part, by radiation generated from the flash lamp.

20. The method for flash lamp processing of claim 19, wherein the radiation generated from the flash lamp heat the first surface of the substrate to a temperature just below the substrate melting temperature.

21. The method for flash lamp processing of claim 19, wherein the first surface of the substrate is above the ion diffusion temperature for a time period of approximately three milliseconds or less.

22. A system comprising:
a pre-flash processing device adapted to process a substrate;
a flash lamp reactor including
a target area adapted to receive the substrate such that the first surface of the substrate corresponds with a first side of the target area;
a reflecting device having a first reflecting zone with a first reflectivity and a second reflecting zone with a second reflectivity that is different from the first reflectivity; and
a flash lamp, disposed between the reflecting device and the target area, to provide radiation to be reflected off the reflecting device substantially towards the first side of the target area; and
a transfer mechanism adapted to transfer the substrate from the pre-flash processing device to the flash lamp reactor.

23. The system of claim 22, wherein the substrate comprises a semiconductor wafer.

24. The system of claim 22, wherein the pre-flash processing device comprises one of a group consisting of an ion implantation device, a metal deposition device, a low-k deposition device, and a high-k deposition device.

25. The system of claim 22, wherein the flash lamp reactor further comprises:
a backside heating device, to emit heat towards a second side of the target area.

26. The system of claim 25, wherein the backside heating device includes a plurality of heating zones, each heating zone capable of being independently controlled.

* * * * *

UNITED STATES PATENT AND TRADEMARK OFFICE
CERTIFICATE OF CORRECTION

| | |
|---|---|
| PATENT NO. | : 7,109,443 B2 |
| APPLICATION NO. | : 10/815068 |
| DATED | : September 19, 2006 |
| INVENTOR(S) | : Knutson et al. |

It is certified that error appears in the above-identified patent and that said Letters Patent is hereby corrected as shown below:

Column 7,
Line 9, "6. ...the reflecting zones..." should read --6. ...the first and second reflecting zones...--.
Lines 11-12, "7. ...first and second zones..." should read --7. ...first and second reflecting zones...--.

Signed and Sealed this

Twenty-second Day of July, 2008

JON W. DUDAS
*Director of the United States Patent and Trademark Office*